United States Patent
Bergogne et al.

(10) Patent No.: US 11,601,038 B2
(45) Date of Patent: Mar. 7, 2023

(54) DRIVER CIRCUIT FOR CONTROLLING A SWITCH AND CIRCUITS COMPRISING SAME

(71) Applicant: Commissariat à l'Energie Atomique et aux Energies Alternatives, Paris (FR)

(72) Inventors: Dominique Bergogne, Grenoble (FR); Guillaume Regis, Grenoble (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 145 days.

(21) Appl. No.: 17/247,450

(22) Filed: Dec. 11, 2020

(65) Prior Publication Data

US 2021/0184558 A1     Jun. 17, 2021

(30) Foreign Application Priority Data

Dec. 12, 2019  (FR) ..................... 1914293

(51) Int. Cl.
*H02M 1/08*      (2006.01)
*H02M 1/00*      (2006.01)
*H02M 7/219*     (2006.01)

(52) U.S. Cl.
CPC ........... *H02M 1/08* (2013.01); *H02M 1/0006* (2021.05); *H02M 7/219* (2013.01)

(58) Field of Classification Search
CPC ...... H02M 1/08; H02M 3/158; H03K 17/063; H03K 2217/0063; H03K 2217/0072; H03K 2217/0081
See application file for complete search history.

(56) References Cited

U.S. PATENT DOCUMENTS

| | | | |
|---|---|---|---|
| 8,013,642 B2* | 9/2011 | Nakagawa | H03K 17/063 327/108 |
| 10,554,112 B1* | 2/2020 | Sharma | H02M 1/08 |
| 2004/0136212 A1 | 7/2004 | Abe et al. | |
| 2006/0132194 A1 | 6/2006 | Harriman | |
| 2007/0195556 A1 | 8/2007 | Nakamura et al. | |
| 2013/0088378 A1 | 4/2013 | Kobayashi et al. | |
| 2013/0214824 A1 | 8/2013 | Umetani | |
| 2019/0140637 A1* | 5/2019 | Chen | H02M 1/08 |
| 2020/0076415 A1* | 3/2020 | Lee | H03K 17/063 |
| 2020/0403607 A1* | 12/2020 | Escudero Rodriguez | H03K 17/063 |

FOREIGN PATENT DOCUMENTS

EP     0055941 A1     7/1982

OTHER PUBLICATIONS

Preliminary Search Report for French Application No. 1914293 dated Aug. 5, 2020, 2 pages.

* cited by examiner

*Primary Examiner* — Kyle J Moody
*Assistant Examiner* — Jye-June Lee
(74) *Attorney, Agent, or Firm* — Moreno IP Law LLC

(57) ABSTRACT

The present disclosure concerns a device including a first switch, a diode, and a passive resistive element electrically in series between conduction and control terminals of the first switch, a terminal of the diode located on the side of the first switch being coupled to a node of application of a potential variable with respect to the potential of said conduction terminal.

15 Claims, 3 Drawing Sheets

DRIVER CIRCUIT FOR CONTROLLING A SWITCH AND CIRCUITS COMPRISING SAME

FIELD

The present disclosure generally concerns electronic devices, particularly the control of switches, more particularly the control of switched-mode converter switches.

BACKGROUND

Controlled switches are used, in particular, in switched-mode converters. The switches are alternately set to the on and off states at a switching frequency. Switched-mode converters are used to deliver a voltage and/or a current, from a power supply having voltage/current values different from the values of the voltage/current to be delivered. For example, an AC-DC (alternating current-direct current) switched-mode converter enables to obtain a DC voltage from an AC voltage such as that of an electric network or of an alternator. Other controlled switches are used in various logic circuits, such as inverters.

Such controlled switches typically comprise field-effect transistors. In certain applications, the transistors are called high electron mobility transistors HEMT, that is, achieving a conduction between the drain and the source via an interface between wide bandgap semiconductors, the electrons being mobile along said interface. The semiconductors may be gallium nitride GaN and aluminum-gallium nitride AlGaN. It is then spoken of a GaN HEMT-type transistor.

Document US 2004/136212 describes a voltage step-up transformer having a structure decreasing noise.

Document US 2007/0195556 describes a control circuit for a power communication device.

Document US 2013/0088378 describes a switching circuit for generating a radio frequency pulse signal, a radio frequency pulse signal generation circuit, and a device detecting target objects.

Document EP 0055941 describes a DC/AC converter capable of operating at high frequencies.

Document US 2006/0132194 describes a power MOSFET control circuit and method.

Document US 2013/214824 describes a control circuit.

SUMMARY

There is a need to improve known switch control devices, in particular known devices for controlling a switch comprising a HEMT-type transistor.

An embodiment overcomes all or part of the disadvantages of known switch control devices.

An embodiment provides a switch control circuit easier to implement than known switch control devices.

An embodiment provides a switch control device, which device may be powered with a potential level which is not adapted to a direct application to the switch in order to control the switch.

An embodiment provides a control device where all switches are formed of HEMT-type transistors.

An embodiment overcomes all or part of the disadvantages of known logic circuits, in particular of known inverters.

An embodiment provides a logic circuit, in particular an inverter, where all switches are formed of HEMT-type transistors.

An embodiment provides a device comprising a first switch, a diode, and a passive resistive element electrically in series between conduction and control terminals of the first switch, a terminal of the diode located on the side of the first switch being coupled to a node of application of a potential variable with respect to the potential of said conduction terminal.

According to an embodiment, said terminal of the diode and said node are coupled by a capacitive element.

More particularly, an embodiment provides a device comprising a first switched formed of a field-effect transistor, a diode, and a first passive resistive element electrically in series between a drain and a gate of the first switch, said drain and an anode of the diode being connected to a terminal of application of a first potential of a power supply voltage (VCC) referenced to a second potential, and a cathode of the diode located on the side of the first switch being coupled, by a capacitive element, to a node of application of a potential variable with respect to said first potential and greater than said second potential.

According to an embodiment, said variable potential corresponds to a square pulse signal varying between the first and second potentials.

According to an embodiment, the first switch is of HEMT type, preferably with GaN.

According to an embodiment, the first resistive element is located between said cathode of the diode and said gate.

According to an embodiment, the device further comprises, in series with the first switch, an additional switch, preferably of HEMT type.

According to an embodiment, wherein a first state (REF) of the variable potential generates the application, to said control terminal, a potential for turning off the first switch.

According to an embodiment, wherein, at first periods when the turn-off potential is not applied, said variable potential is at a level generating a setting to the on state of the first switch.

According to an embodiment, wherein the variable potential is at a level for turning off the first switch during second periods of application of the turn-off potential and during third periods located at the beginning and at the end of each first period.

According to an embodiment, the device comprises an inverter coupling said node to a control terminal of a second switch configured to apply the turn-off potential to the control terminal of the first switch, the second switch being preferably of HEMT type.

According to an embodiment, the inverter comprises another passive resistive element and a third switch in series, an input coupled to the gate of the third switch, and an output coupled to a node of connection between said transistor and said other resistive element, the third switch being preferably of HEMT type.

According to an embodiment, the device comprises a second resistor in series with said diode (D220) between said terminal of application of the first potential and a node between the first resistive element and said capacitive element.

An embodiment provides an inverter comprising the device such as defined hereabove.

According to an embodiment, the inverter of a device such as described hereabove is an inverter comprising a device such as described hereabove.

An embodiment provides a controlled switch control circuit, comprising a device such as defined hereabove, said controlled switch preferably comprising one or a plurality of HEMT-type transistors.

An embodiment provides a monolithic circuit comprising a device such as defined hereabove, or comprising a circuit such as defined hereabove, preferably comprising said controlled switch.

An embodiment provides a switched-mode converter comprising one or a plurality of devices such as defined hereabove or a circuit such as defined hereabove.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF THE PRESENT EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the converter structures and the methods of generation of switched-mode converter switch control signals, are not described in detail, the embodiments being compatible with all or most of usual switched-mode converters.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Unless specified otherwise, ordinal numerals such as "first", "second", etc. are only used to distinguish elements from one another. In particular, these adjectives do not limit the described devices and methods to a specific order of these elements.

Figure 1:
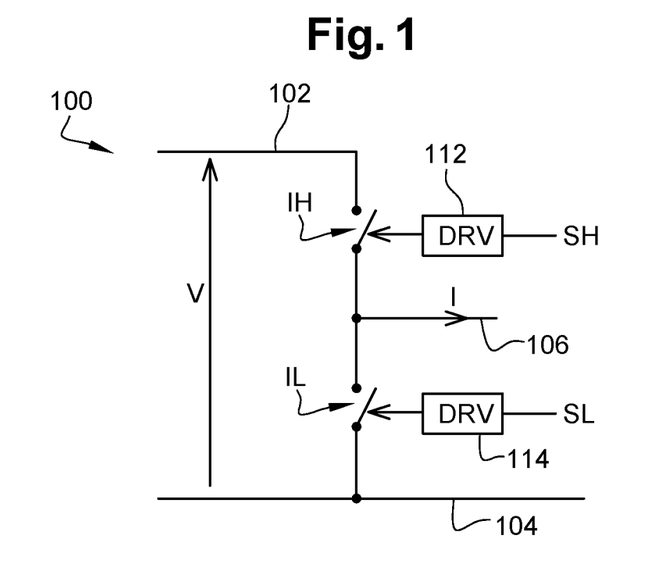
FIG. 1 very schematically shows a switching cell of a converter of a type to which the described embodiments apply.

FIG. 1 schematically shows a switching cell of a converter of a type to which the described embodiments apply.

A switching cell is defined by the association of two switches IH and IL electrically in series between nodes 102 and 104. Preferably, switches IH and IL are of HEMT type. HEMT-type switch means that the switch comprises, or is formed by, a HEMT-type transistor, preferably with GaN, or a plurality of HEMT-type transistors, preferably with GaN, in series and/or in parallel. HEMT transistors enable to block higher voltages and enable faster switchings than other types of field-effect transistors.

Preferably, the transistors comprised in, or forming, switches IL and IH when the latter are of HEMT type are enhancement mode HEMTs. Switches IL and IH are then also of so-called enhancement mode HEMT type. Such switches or transistors are then of normally-off type, that is, non-conductive in the absence of a control voltage (gate-source voltage). As a variant, the transistor(s) comprised in, or forming, one and/or the other of HEMT-type switches IL and IH may also be of depletion mode HEMT type. The concerned switch is also of so-called depletion mode HEMT type. Such switches or transistors are then of so-called normally-on type, that is, conductive in the absence of a control voltage (in other words, with a null control voltage).

Signals SH and SL for controlling respective switches IH and IL are applied to respective switches IH and IL by driver circuits (DRV), respectively 112 and 114, or transistor gate control circuits. Signals SH and SL are such that, when one of switches IH and IL is on, the other one of the switches is off. Thus, switches IH and IL are not simultaneously on. Switches IH and IL may also be simultaneously off.

The converter where switching cell 100 is located receives or delivers a voltage V. The converter receives or delivers a current I on a node 106 of series connection of switches IH and IL. Current I is received or delivered by elements, not shown, of the converter. Current I is for example the current in an inductance, not shown, internal to the converter. The converter structure is not detailed herein, the described embodiments being compatible with usual switched-mode converters and usual switched-mode converter switch drivers.

In a typical application, voltage V is an AC voltage originating from an electric distribution system and has, for example, a rms. voltage in the order of approximately 100 V or of approximately 230 V, and, for example, a frequency equal to 50 Hz or 60 Hz. The converter delivers a DC voltage, obtained from current I by portions, not shown, of the converter. The DC voltage is typically used to charge a battery, for example, a battery of a laptop computer or of a mobile distant communication device such as a cell phone. More particularly, the battery charge may be performed via a connection of universal serial bus USB type, preferably with a power delivery.

Control signals SH and SL are typically square pulse signals. Square pulse signal means a signal comprising a succession of cycles, each cycle comprising a portion at a low level of the signal and a portion at a high level of the signal. The cycles of signals SH and SL are repeated at a switching frequency. Thus, at the switching frequency, switch IH is turned on and switch IL is turned off and then, in alternation, switch IL is turned on a switch IH is turned off. The methods of generation of the signals of the switches to obtain the desired operation of the converter are not described in detail, the described embodiments being compatible with usual methods for generating such signals.

The described embodiments are applicable to any switched-mode converter. In particular, the converter may deliver and/or receive a single-phase or multiphase AC voltage. The described embodiments are also applicable to any converter comprising, between two nodes of application of a voltage, for example, AC, or of application of a phase of a multiphase AC voltage, one or a plurality of branches in parallel, each formed of a switching cell comprising at least two switches in series. Thus, the converter may deliver a voltage, for example, a multiphase AC voltage, to a motor.

Figure 2:
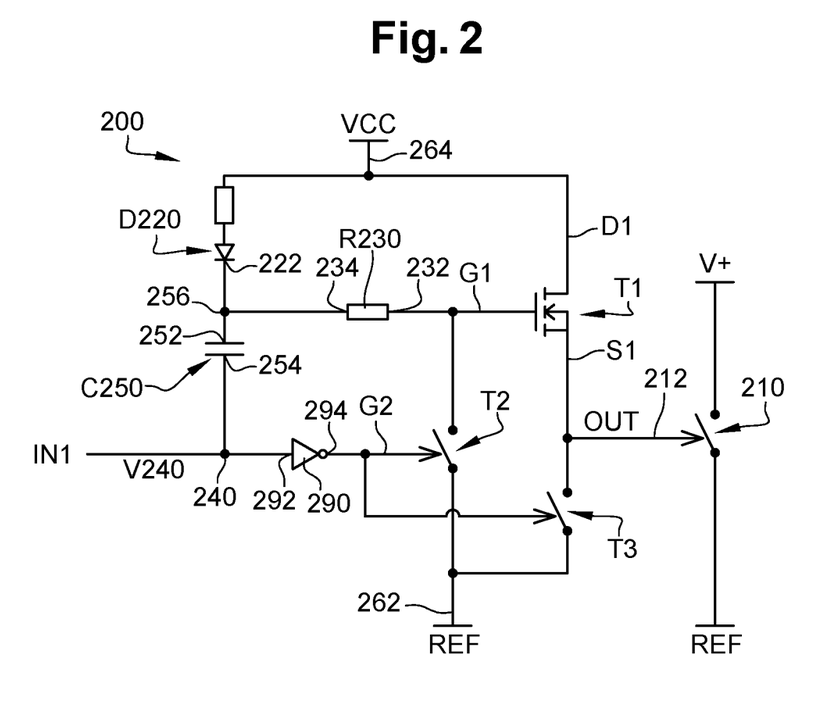
FIG. 2 very schematically shows an embodiment of a switch control device and the switch controlled by the device.

FIG. 2 very schematically shows an embodiment of a device 200 for controlling a switch 210, and the switch 210 controlled by device 200. Device 200, or circuit 200 is typically intended, in a converter comprising one or a plurality of switching cells of the type of the cell 100 of FIG. 1, to replace one and/or the other of circuits 112 and 114 (FIG. 1). Switch 210 may then form one or the other of switches IH and IL of the switching cell 100 of FIG. 1.

Device 200 comprises a first switch, T1. Preferably, first switch T1 comprises, for example is formed by, a field-effect transistor, with an N channel in the shown example. The transistor then has drain, source, and gate terminals D1, S1, and G1. The drain and source terminals of such a switch form conduction terminals of the switch, that is, terminals between which the switch creates an electric connection when it is in its on state, and between which the switch forms an electric isolation when it is in its off state. The gate forms a control terminal of the switch. More preferably, switch T1 is of HEMT type. More generally, switch T1 may be of any usual switch type having conductive terminals D1 and S1 and a control terminal G1, and having its on/off state controlled by a voltage between control terminal G1 and conduction terminal S1. Preferably, switch T1 is of normally-off type. In the present embodiment, the conduction terminal S1 of switch T1 corresponds to an output of device 200. This output is coupled, preferably connected, to a control terminal 212 of switch 210 and exhibits an output potential OUT of device 200.

Device 200 comprises a diode D220 and a resistive element 8230 electrically in series between the conduction terminal D1 of switch T1 and the control terminal G1 of switch T1. More particularly, resistive element 8230 and diode D220 are directly connected to each other. In the shown example, resistive element 8230 is located between diode D220 and the control terminal G1 of switch T1. Diode D220 is thus, in this example, coupled, preferably connected, to conduction terminal D1, and resistive element 8230 is coupled, preferably connected, to control terminal G1.

Preferably, diode D220 comprises, for example is formed by, a normally-off transistor, more preferably of HEMT type, more preferably with GaN. The transistor is diode-assembled, that is, it has its gate coupled, preferably connected, to one of the conduction terminals. The selection of the conduction terminal coupled to the gate among the source or drain terminals is within the abilities of those skilled in the art based on the desired properties of the diode. In the example of an N-channel transistor, the conduction terminal coupled to the gate forms an anode terminal of the diode, and the conduction terminal which is not coupled to the gate forms a cathode terminal of the diode.

A terminal 222 of diode D220 (the cathode in the shown example) faces control terminal G1. The terminal 222 of diode D220 is coupled, preferably by a capacitive element C250, more preferably a capacitor, to a node 240 of application of a variable potential V240. The terminal 222 of diode D220 is then coupled, preferably connected, to a terminal or electrode 252 of capacitive element C250. In other words, the terminal 252 of capacitive element C250 is coupled, preferably connected, to a node 256. The terminal 222 of diode D220 is coupled, preferably connected, to node 256. In other words, node 256 is coupled to control terminal G1 and is located on the side of control terminal G1 with respect to diode D220. In the shown example, node 256 is located between diode D220 and resistive element 8230. The other terminal (terminal 254) of capacitive element C250 is coupled, preferably connected, to node 240.

In operation, potential V240 is variable with respect to the potential of conduction terminal D1. In other words, the difference between the potential V240 applied to node 240 and the potential of conduction terminal D1 is time-variable. According to an embodiment, the potential of node 240 corresponds to a control signal to be applied by device 200 to switch 210. Preferably, potential V240 remains smaller than the potential of conduction terminal D1. In particular, when, in a switching cell such as that of FIG. 1, device 200 replaces driver circuit 112 or 114 (FIG. 1), potential V240 corresponds to a signal IN1 formed by the respective signal SH or SL (FIG. 1), or generated from the respective signal SH or SL by circuits, not shown.

This enables to charge capacitive element C250. Indeed, when the potential applied to node 240 deviates from that of conduction terminal D1, a current may flow through diode D220 to power capacitive element C250. When the potential applied to node 240 comes closer to that of conduction terminal D1, the potential of the cathode of diode D220 rises above the potential of conduction terminal D1. This then enables to apply to the control terminal G1 of the first switch T1 a potential capable of being higher than that of conduction terminal D1. In the shown example, the potential is applied to control terminal G1 via resistive element R230.

Preferably, in the case where first switch T1 is of normally-off type, the amplitude of the variations of potential V240 with respect to the potential of conduction terminal D1 (that is, the variable voltage between node 240 and conduction terminal D1) is greater than a threshold voltage of first switch T1. The amplitude of the variations means the interval between maximum and minimum levels, over time, of the variable voltage between conduction terminal D1 and node 240. In the example where this voltage (potential difference) is of square pulse type, this amplitude corresponds to the interval between the high and low levels of the potential difference. In the case where switch T1 comprises a field-effect transistor, the threshold voltage is defined by the voltage between the gate and the source for which a conduction channel appears between the drain and the source.

Thus, in the case where the first switch T1 is of normally-off type, this enables to maintain switch T1 on by setting the potential applied to node 240 to a high level. More particularly, switch T1 is maintained on while its conduction terminals S1 and D1 are, due to the very fact that switch T1 is on, at the same potential or substantially at the same potential. This thus enables to maintain switch T1 in the on state while the potential of conduction terminal D1 is poorly adapted to be directly applied to the control terminal of switch T1 to maintain switch T1 in the on state. This is obtained without delivering to device 200 a potential greater than that of conduction terminal D1. Power supply voltage VCC alone is thus sufficient to power device 200. The implementation of device 200 is thus simpler than that of devices provided to be powered with two power supply voltages.

As a variant, capacitive element C250 may be replaced with any device enabling to apply to node 256 a variable potential temporarily greater than the potential of conduction terminal D1. Diode D220 then enables to power such a device with a current when the potential applied to node 256 is smaller (to within a diode threshold voltage) than the potential of conduction terminal D1.

Preferably, device 200 further comprises terminals, or nodes, 262, 264 of reception by device 200 of a power supply voltage VCC referenced to a potential REF of terminal 262. Conduction terminal D1 is coupled, preferably connected, to terminal 264. Potential REF is preferably that of a conduction terminal of switch 210 controlled by device 200, more preferably a source terminal of switch 210. Thus, the terminal 262 of device 200 is intended to be coupled, preferably connected, to this conduction terminal. Preferably, the potential V240 of node 240 is greater than potential VREF. Potential V240 then preferably varies between potential REF and the potential of conduction terminal D1.

Power supply voltage VCC may be delivered to device 200 by a power supply circuit, not shown. The power supply circuit may then itself be powered with a voltage (voltage V, FIG. 1) across a switching cell such as switching cell 100 (FIG. 1). The power supply circuit may also be powered with a voltage V+ present across switch 210. Voltage V+ is preferably referenced to potential REF. As a variant, device 200 is directly powered with voltage V+, terminals 262 and 264 being coupled, preferably connected, to the respective terminals of switch 210, preferably to the respective drain and source terminals of switch 210.

Preferably, device 200 further comprises a second switch, T2, coupling the control terminal G1 of first switch T1 to the terminal 262 of application of power supply potential REF. Potential REF is then selected so that its application to the control terminal G1 of first switch T1 causes the turning off of this switch. In other words, potential REF is a potential for turning off switch T1. In operation, the setting to the on state of second switch T2 enables to temporarily apply potential REF to the control terminal G1 of first switch T1. At periods during which turn-off potential REF is not applied to control terminal G1, the second switch T2 then is in the off state. The setting to a high level of the potential V240 applied to node 240 during these periods turns on first switch T1, as described hereabove.

Preferably, the link between the control terminal G1 of first switch T1 and the terminal 262 of application of turn-off potential REF only comprises second switch T2, with no other element in series such as a resistor (except for a parasitic resistance of switch T2 in its on state). Indeed, the lower the on-state resistance of switch T2 between control terminal G1 and terminal 262, the more T1 has the advantage of being rapidly turned off.

Switch T2 and terminal 262 form a device of temporary application of turn-off potential REF to control terminal G1. As a variant, any usual device of temporary application of a turn-off potential to a control terminal of a switch may be used instead of switch T2 and of terminal 262.

According to the described embodiments, resistive element R230 is passive. Passive element here means that this element is intended to be electrically coupled to elements external to the passive element by two terminals (232 and 234 for resistive element R230), preferably unique, between which the passive element has an electric property, such as a resistance, the passive element being deprived of another terminal intended to be used by an element external to the passive element to modify or substantially modify this electric property. In other words, such a passive element receives, besides, possibly, a current flowing therethrough from one to the other of the two terminals and/or a voltage between these two terminals, no signal, potential, or for example, power supply voltage capable of influencing or of substantially influencing a relationship between the current and the voltage. In particular, passive resistive element R230 has a constant or substantially constant value, possibly to within variations which are only a function of parameters such as temperature or aging. Thus, the resistance value is independent from the low/high level of the potential applied to node 240, in other words, the resistance value does not vary during a switching between low/high levels of the potential of node 240. Particularly, the link between node 256 and the control terminal G1 of transistor T1 is passive.

When turn-off potential REF is applied to the control terminal G1 of first switch T1 (switch T2 on), resistive element R230 enables to limit the current flowing from terminal 264 to terminal 262 and passing through diode D220, resistive element R230, and second switch T2. In the shown example, when second switch T2 is turned off, resistive element R230 applies the potential of node 256 to control terminal G1.

Preferably, resistive element R230 is a resistor. Resistive element R230 may also be formed by any passive element enabling to transmit a voltage between its terminals in the absence of a current and to limit a current in the presence of a voltage thereacross. Resistive element R230 preferably has a resistance value in the range from 100Ω to 100 kΩ, more preferably from 1 kΩ to 10 kΩ, for example, in the order of 3 kΩ. Such values enable, for most applications, to optimize the compromise between the turn-on speed of first switch T1 and the current consumption when second switch T2 is in the on state. For example, these values are particularly adapted to the case where controlled switch 210 has a stray gate/source capacitance in the range from 20 pF to 2 nF, for example, in the order of 200 pF. Switch T1 can then be selected to obtain turn-on times of switch 210 shorter than 30 ns, for example, in the order of 5 ns. More generally, it will be within the abilities of those skilled in the art to modify the above-described values to optimize this compromise according to the targeted application.

When potential V240 is at its high level, the link between node 256 and the control terminal G1 of transistor T1 is at a potential higher than that of conduction terminals S1 and D1. The fact of providing for this link to be passive enables, as compared with a link which would comprise active components, to avoid delivering a control signal to this link. This is particularly advantageous in the case where switches T1 and T2 are of normally-off HEMT type, since it is then avoided to use a switch of different type than that of switches T1 and T2 and/or to use a potential level greater than that of the link to control an on state. An implementation of device 200 simpler than that of transistor gate control devices provided to be powered with a potential greater than that of conduction terminals S1 and D1 is obtained, as well as the possibility of selecting the same normally-off type for all the switches of device 200. The selection of switches of a same type eases the switch manufacturing.

A device enabling to control the on/off state of the first switch in a particularly simple way compatible with the use of switches of a same type only has thus been obtained. Preferably, all the switches of device 200 are of normally-off HEMT type, that is, switches T1 and T2 and, unless specified otherwise, the possible other switches of device 200, described hereafter.

Preferably, device 200 is monolithic, that is, all its circuits are circuits integrated inside and on top of a same substrate or support, typically inside and on top of a same semiconductor wafer portion. Such a monolithic integrated circuit is preferably located in an integrated circuit package. Integrated circuit package means an assembly, preferably tight, having areas of connection or pins of connection to electronic circuits external to the circuit, for example, to a printed circuit board PCB, jutting out of it. As compared with a variant where device 200 comprises a plurality of monolithic components, this allows an easier implementation, in particular to form a switching cell.

The fact of providing for all switches to be of a same type enables, as compared with a device comprising switches of different types, to make it possible or easier to manufacture the switches on the same substrate or support to form the monolithic device.

More preferably, the switches of device 200 are of the same type as that of controlled switch 210. Device 200 and switch 210 are then preferably integrated in a same monolithic device. This enables, in particular, to simplify the forming of a switching cell such as that of FIG. 1 where driver circuits 112 and 114 (FIG. 1) and switches IH and IL (FIG. 1) are replaced with such monolithic devices. This thus enables to simplify the forming of a converter comprising such a switching cell. The monolithic device may further comprise one or a plurality of other devices of the type of, or identical to (to within manufacturing tolerances), device 200. These devices are respectively coupled, preferably connected, to switches of the type of, or identical to (to within manufacturing tolerances), switch 210. In particular, it may be provided for one or a plurality of switching cells to be located in a same monolithic device or component.

Preferably, as in the shown example, resistive element R230 is located between diode D220 and the control terminal G1 of the first switch. More particularly, resistive element R230 is located between node 256 and control terminal G1. This enables, during periods when switch T2 is in the on state, to limit a discharge current of capacitive element C250 from node 240 to terminal 262. In a variant, resistive element R230 and diode D220 are in series between the conduction terminal D1 of switch T1 and node 256, node 256 being coupled, preferably connected, to control terminal G1. In this variant, any device enabling to limit the discharge of capacitive element C250 when second switch T2 is on may be provided, such as another switch comprised in the link between node 240 and capacitive element C250. However, as compared with such a variant, the fact of providing for resistive element R230 to be located between diode D220 and control terminal G1 enables to simplify the device.

According to an alternative embodiment, an additional resistor of low value (smaller than 100 ohms, preferably smaller than 10 ohms) is provided in series with diode D220 between terminal 264 and node 256. Such a resistor enables to limit the charge current of capacitive element C250.

Preferably, device 200 further comprises a switch T3. Switch T3 couples the conduction terminal of first switch T1 to terminal 262 of application of potential REF. Preferably, switch T3 is of normally-off HEMT type, more preferably with GaN. Preferably, switch T3 has its control terminal coupled, preferably connected, to the control terminal G2 of second switch T2. Thus, during periods of application of turn-off potential REF to control terminal G1 (switch T2 on), switch T3 is also on, which enables to apply a low control level to switch 210, for example, a level for setting switch 210 to the off state. During periods during which turn-off potential REF is not applied to control terminal G1 (switch T2 off), switch T3 is also off, which enables, when switch T1 is on, to apply a high control level to switch 210, for example, a level for setting switch 210 to the on state.

Preferably, device 200 further comprises an inverter 290 between node 240 and the control terminal of the second switch. In the present embodiment, node 240 is coupled, preferably connected, to the input of inverter 290, and the control terminal of switch T2 is coupled, preferably connected, to the output of the inverter. Thus, the potentials applied to the control terminals of the different switches T1 and T2, as well as the possible switch T3, are generated from a same control signal (such as signals SH or SL, FIG. 1) applied to node 240.

Figure 4:
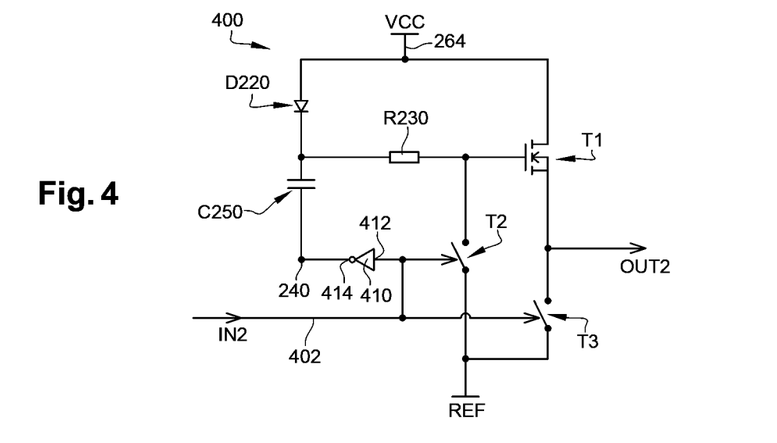
FIG. 4 very schematically shows an embodiment of an inverter.

More particularly, inverter 290 is different from an inverter comprising switch T1, for example, an inverter comprising switch T1 and T3, such as that described hereafter in relation with FIG. 4. As compared with a variant where node 240 is coupled to conduction terminal S1, this enables, in particular, to control switch T1 independently from the presence or the absence of switch T3, and/or independently from the potential of conduction terminal S1.

Although, according to the present embodiment, the potential applied to node 240, the control potential of switch T2, and possibly T3, are generated from the potential applied to node 240 by inverter 290, inverter 290 may be replaced with any circuit capable of generating, from a same control signal such as signals SH and SL (FIG. 1), variable potentials, preferably inverse to each other, to node 240 and to the control terminal G2 of switch T2. Examples of such circuits are described hereafter in relation with the following drawings.

Figure 3:
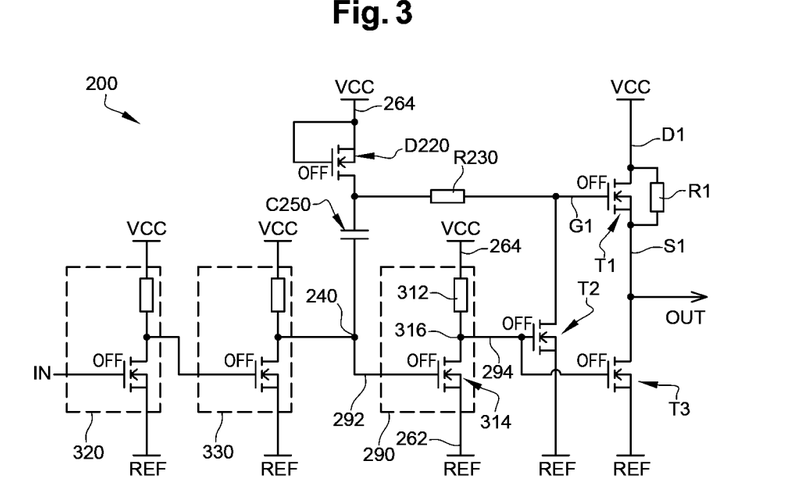
FIG. 3 schematically shows an embodiment of the control device of FIG. 2.

FIG. 3 schematically shows, but in more detailed fashion than in FIG. 2, an embodiment of the control device 200 of FIG. 2. Switch 210 (FIG. 2), external to device 200, is not shown.

In this embodiment, switches T1, T2, and possible switch T3 are normally-off (OFF) HEMT-type transistors, preferably with GaN. Diode D220 is formed by a diode-assembled normally-off HEMT-type switch, preferably with GaN. A resistor R1 may optionally be in parallel with switch T1.

Inverter 290 comprises, in series between terminals 264 and 262, a passive resistive element 312, preferably a resistor, and a switch 314. Switch 314 is of normally-off (OFF) HEMT-type, preferably with GaN. Resistive element 312 has a terminal coupled, preferably connected, to terminal 264, and another terminal coupled, preferably connected, to the drain terminal of switch 314. The source terminal of switch 314 is coupled, preferably connected, to terminal 262. The control (gate) terminal of switch 314 is coupled, preferably connected, to the input 292 of inverter 290, or forms the input 292 of inverter 290. A connection node 316 between the drain terminal of switch 314 and resistive element 312 is coupled, preferably connected, to the output 294 of inverter 290, or forms the output 294 of inverter 290. In the device 200 obtained, all the switches then are of normally-off HEMT type, preferably with GaN.

As an example, the potential applied to node 240 is delivered by two inverters 320 and 330 in series between an input of the device 200 receiving a signal IN and node 240. More particularly, inverter 320 receives signal IN on its input and inverter 330 receives the output signal of inverter 320. Inverter 330 has its output coupled, preferably connected, to node 240 and delivers the potential applied to node 240. Inverters 320 and 330 comprise elements identical or similar to those of inverters 290, arranged identically or similarly. These elements are not described again.

FIG. 4 schematically shows an embodiment of an inverter 400 receiving an input signal IN2 and delivering an output signal OUT2. Inverter 400 comprises elements identical or similar to those of the gate control device 200 of FIG. 2. These elements are not described in detail again hereafter. Only the differences are highlighted.

Inverter 400 receives input signal IN2 on an input 402. Conversely to the device 200 of FIG. 2, input 402 is coupled, preferably connected, to the control terminals of switches T2 and T3. Inverter 400 further differs from device 200 by the fact that inverter 290 has been replaced with an inverter 410. Inverter 410 has an input 412 coupled, preferably connected, to the input 402 of inverter 400, and an output 414 coupled, preferably connected, to node 240. Thus, inverter 400 and device 200 differ in that their respective inverters 410 and 290 are in opposite directions.

According to an embodiment, not shown, a control device comprises elements identical or similar to those of inverter 400, arranged identically or similarly. Such a device then differs from the device 200 of FIG. 2 in that, for a same input signal (IN1 in FIG. 2, and IN2), the high and low levels of output signal OUT2 are inverted with respect to those of the output signal OUT of device 200.

According to another embodiment, a buffer circuit comprising elements identical or similar to those of the device 200 of FIG. 2, arranged identically or similarly, is provided. Such a buffer circuit then differs from inverter 400 in that, for a same input signal, the high and low levels of output signal OUT are inverted with respect to those of the output signal OUT2 of inverter 400.

Preferably, inverter 410 comprises elements identical or similar to those of the example of the inverter 290 of FIG. 3, arranged identically or similarly. These elements are not described again herein. Preferably, as in the embodiment of device 200 described in relation with FIG. 3, all the switches of inverter 400 are of normally-off HEMT type, preferably with GaN.

As compared with the example of inverter 290 described in relation with FIG. 3, in inverter 400, during a switching between the high and low state of the output, the current increases more rapidly for a same current consumed on power supply voltage VCC. This enables to accelerate the charging of stray capacitances of gates connected to the inverter output.

Preferably, in the switch control device 200 of FIG. 2, inverter 290 is replaced with an inverter of the type of inverter 400 of FIG. 4. This then enables to accelerate switchings between on and off states and between off and on states of switch 210 controlled by device 200 (FIG. 2).

In the inverter 400 of FIG. 4, inverter 410 may also be replaced with an inverter of the type of inverter 400. This allows an additional acceleration of a circuit using inverter 400, for example, a device of the type of device 200 where inverter 290 is replaced with this inverter 400 comprising an inverter of the type of inverter 400 of FIG. 4.

Similarly, in the inverter of the type of inverter 400 replacing inverter 410 in an inverter 400, inverter 410 may again be replaced with another inverter of the type of inverter 400. Inverter 410 may further be replaced, and so on, recursively. The number of successive replacements of an inverter 410 with an inverter of the type of inverter 400 (that is, the recursion depth), is for example greater than or equal to 2, 3, or 4.

Figure 5:
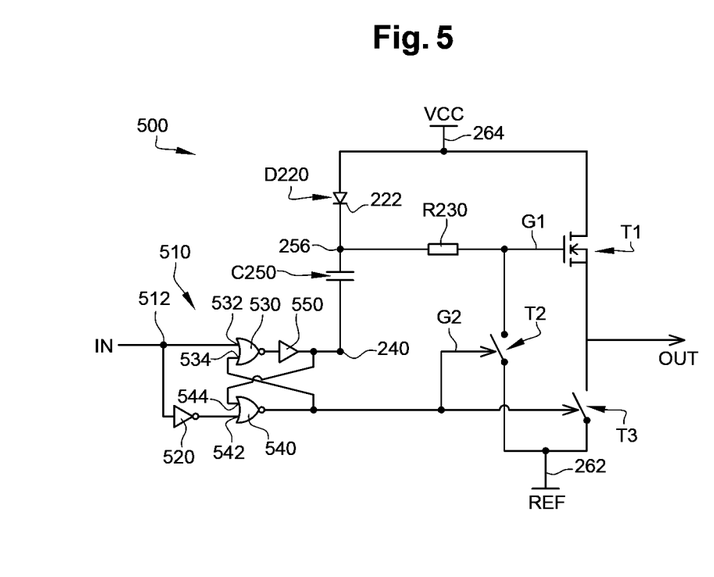
FIG. 5 very schematically shows another embodiment of the circuit for controlling FIG. 2.

FIG. 5 very schematically shows another embodiment of a device 500 for controlling a switch, not shown. Device 500 comprises elements identical or similar to those of the device 200 of FIG. 2, arranged identically or similarly. Only the differences are highlighted hereafter.

The device 500 of FIG. 5 differs from that of FIG. 2 in that inverter 290 (FIG. 2) has been replaced with a logic circuit 510. Circuit 510 is capable of generating from a signal IN different variable potentials on node 240 and on the control terminal G2 of switch T2. Signal IN is a signal corresponding to the control to be applied to the switch controlled by circuit 500. Signal IN for example corresponds to one of the signals SH and SL described in relation with FIG. 1.

Circuit 510 receives signal IN on an input 512. Circuit 510 comprises an inverter 520 having an input coupled, preferably connected, to input 512. Circuit 510 comprises a NOR logic gate 530 having an input 532 coupled, preferably connected, to input 512. Circuit 510 comprises a NOR logic gate 540 having an input 542 coupled, preferably connected, to the output of inverter 520. Logic gate 540 has its output coupled, preferably connected, to an input 534 of logic gate 530. Circuit 510 comprises a buffer circuit 550 having an input coupled, preferably connected, to the output of logic gate 530. Buffer circuit 550 has its output coupled to an input 544 of logic gate 540. The output of buffer circuit 550 is coupled, preferably connected, to node 240. The output of logic gate 540 is coupled, preferably connected, to the control terminal G2 of switch T2.

Figure 6:
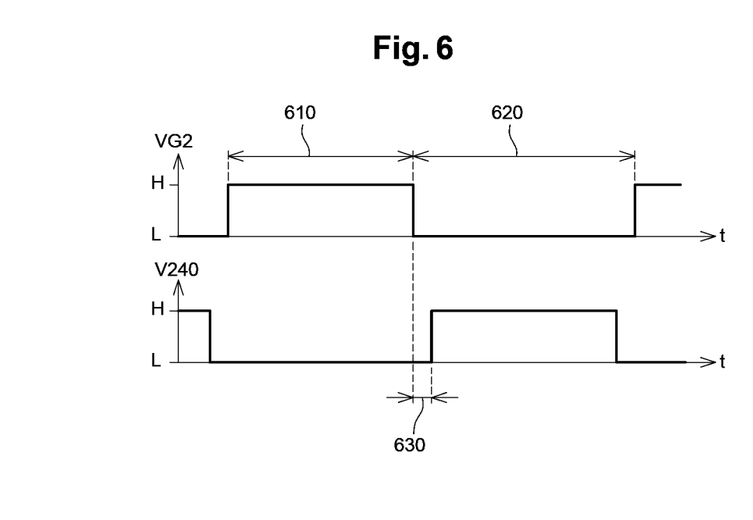
FIG. 6 shows, in simplified timing diagrams, the operation of the device of FIG. 5.

FIG. 6 shows, in simplified timing diagrams, the operation of the device 500 of FIG. 5. More particularly, curves of the potential V240 applied to node 240 and of the potential VG2 applied to the control terminal G2 of switch T2 according to time t have been shown.

Signal IN (FIG. 5) is preferably a square pulse signal. Each of the potentials V240 and VG2 delivered by circuit 510 is also a square pulse signal between low (L) and high levels (H) at the same frequency as that of signal IN. Thus, in the case where device 500 is used to control a switch of a switching cell such as that in FIG. 1, this frequency is the switching frequency. Potential VG2 is alternately at its high level during periods 610 and at its low level during periods 620. Periods 610 and 620 are thus periods respectively of application and of non-application of turn-off potential REF to the control terminal G1 of first switch T1.

Potential V240 is at its high level during periods 620, more particularly during part of each period 620. Due to the fact that turn-off potential REF is not applied to control gate G1, this sets first switch T1 to the on state.

Potential V240 is at its low level during periods 610 when second switch T12 is in the on state. The low level of potential V240 is selected to cause the turning off of the first switch. In the preferred embodiment where node 240 is coupled to terminal 222 of diode D220 by capacitive element C250, and where the first switch is of normally-off type, the low level of potential V240 causes this turning-off whatever the low level of square pulse potential V240.

At periods 630 at the beginning and at the end of each period 620, potential V240 is also at its low level, causing the turning off of first switch T1.

In the preferred case where the control terminal G2 of second switch T2 is coupled or connected to the control terminal of switch T3, switch T3 then is respectively off and on during respective periods 620 and 610. Circuit 510, and in particular the delay induced by buffer circuit 550 between its input and its output, are selected according to the various response times of switches T1, T2, and T3. The selection is so that switch T1 is only on during periods 620 when switch T3 is off and so that first switch T1 is in the off state all along the periods 610 during which switch T3 is on. Such a selection it within the abilities of those skilled in the art based on the above functional indications. The absence of a shorting by switches T1 and T3 of power supply terminals 264 and 262 is thus guaranteed.

Various embodiments and variants have been described. Those skilled in the art will understand that certain features of these embodiments can be combined and other variants will readily occur to those skilled in the art. In particular, a node 256 coupled or connected to diode D220 and located, with respect to diode D220, on the side of control terminal G1, has been described in relation with FIG. 2. The circuit 510 of FIG. 5 and capacitive element C250 may then be replaced with any circuit configured to deliver variable potentials on control terminals G2 and on this node 256. The variable potentials may have variations identical or similar to those of the potentials VG2 and V240 described in relation with FIG. 6.

The embodiments are not limited to switch control devices, such as devices 200 (FIG. 2) and 500 (FIG. 5), and to inverters such as inverter 400 (FIG. 4). In the case where switch T3 is omitted, a device such as above-described devices 200, 400, and 500 may be used to control any N-channel field-effect transistor having its drain potential at a high power supply potential level, this transistor preferably being of normally-off type. In particular, inverter 400 is a non-limiting example of a logic circuit. Each P-channel transistor of usual logic circuits may be replaced with the first N-channel switch T1 of a device of the type of devices 200, 400, and/or 500 deprived of switch T3. This is particularly advantageous to form logic circuits only from HEMT-type transistors, preferably with GaN.

Although, in above-described embodiments, N-channel HEMT-type switches are described, it will be within the abilities of those skilled in the art to adapt these embodiments to other types of transistors, for example, with a P channel and preferably normally off, by inverting the anode and the cathode of diode D220 and the signs of the voltages.

Finally, the practical implementation of the described embodiments and variants is within the abilities of those skilled in the art based on the functional indications given hereabove.

What is claimed is:

1. A driver circuit comprising a first switch formed of a field-effect transistor, a diode, and a first passive resistive element electrically coupled in series between a drain and a gate of the first switch, said drain and an anode of the diode being connected to a terminal of application of a first potential of a power supply voltage referenced to a second potential, and a cathode of the diode being coupled, by a capacitive element, to a node of application of a variable potential with respect to said first potential and greater than said second potential, said node being an input of said driver circuit and said variable potential corresponding to a control signal to be provided at an output of said driver circuit.

2. The driver circuit according to claim 1, wherein said variable potential corresponds to a square pulse signal varying between the first and second potentials.

3. The driver circuit according to claim 1, wherein the first switch is of HEMT type.

4. The driver circuit according to claim 1, wherein the first resistive element is located between said cathode of the diode and said gate.

5. The driver circuit according to claim 1, further comprising, in series, with the first switch, an additional switch.

6. The driver circuit according to claim 1, wherein a first state of the variable potential generates the application of a turn-off potential to the gate of the first switch.

7. The driver circuit according to claim 6, wherein, at first periods when the turn-off potential is not applied to the gate of the first switch, said variable potential is at a level generating a setting to an on state of the first switch.

8. The driver circuit according to claim 7, wherein the variable potential is at a level for turning off the first switch during second periods of application of the turn-off potential to the gate of the first switch and during third periods located at a beginning and at an end of each first period.

9. The driver circuit according to claim 6, comprising an inverter coupling said node to a control terminal of a second switch configured to apply the turn-off potential to the gate of the first switch.

10. The driver circuit according to claim 9, wherein the inverter comprises another passive resistive element and a third switch in series, an input coupled to a gate of the third switch, and an output coupled to a node of connection between said second switch and said other passive resistive element.

11. The driver circuit according to claim 1, comprising a second resistor in series with said diode between said terminal of application of the first potential and a node between the first passive resistive element and said capacitive element.

12. An inverter comprising the driver circuit according to claim 1.

13. A circuit for controlling a controlled switch, comprising the driver circuit according to claim 1.

14. The circuit of claim 13, wherein the circuit is a monolithic circuit.

15. A switched-mode converter comprising one or a plurality of driver circuits according to claim 1.

* * * * *